United States Patent
Otani

(10) Patent No.: US 7,430,488 B2
(45) Date of Patent: Sep. 30, 2008

(54) METHOD FOR CONTROLLING A MEASURING APPARATUS

(75) Inventor: Takuya Otani, Tokyo (JP)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/076,734

(22) Filed: Mar. 10, 2005

(65) Prior Publication Data
US 2005/0209809 A1 Sep. 22, 2005

(30) Foreign Application Priority Data
Mar. 22, 2004 (JP) .............................. 2004-083340

(51) Int. Cl.
*G01D 1/00* (2006.01)
(52) U.S. Cl. ..................................... 702/127
(58) Field of Classification Search ................ 702/127, 702/118, 120, 121, 125; 700/28, 46, 75
See application file for complete search history.

(56) References Cited

U.S. PATENT DOCUMENTS

| | | | |
|---|---|---|---|
| 4,972,099 A * | 11/1990 | Amano et al. | 382/313 |
| 6,621,763 B2 * | 9/2003 | Lyon | 367/99 |
| 6,751,512 B1 * | 6/2004 | Kumamoto | 700/94 |
| 2002/0013835 A1 | 1/2002 | Umezu et al. | 709/223 |

* cited by examiner

*Primary Examiner*—Bryan Bui
*Assistant Examiner*—Aditya S Bhat
(74) *Attorney, Agent, or Firm*—Marc Bobys

(57) ABSTRACT

A measurement system comprising modules for receiving analog measurement signals and outputting digital data and a controller for receiving and data processing of these digital data, this measurement system, wherein these modules comprise a A/D converter for converting analog measurement signals to digital data and measuring these data, an output for outputting these digital data, and a controller for controlling the timing of these measurements and the timing of these outputs, and in that the control by the controller is accomplished by outputting during the breaks between multiple measurements.

10 Claims, 5 Drawing Sheets

METHOD FOR CONTROLLING A MEASURING APPARATUS

FIELD OF THE INVENTION

The present invention relates to a method for measuring analog signals, particularly a method for measuring with a measurement system that transfers measurement data between modules and a controller.

DISCUSSION OF THE BACKGROUND ART

A large number of signals are input in order to be measured by measurement systems that measure the many properties of LSIs, TFT arrays, and other semiconductor devices, and these systems often integrate and analyze the measurement data using an actuator that is divided into modules responsible for analog measurement and analog-digital conversion (ADC) and a controller part that processes and analyzes the digital data obtained from the modules, as in Japanese Kokai [Unexamined] Patent 2001-52,281.

A typical measurement system having an actuator divided into modules and a controller is described while referring to the structural drawing in FIG. 4 and the time chart in FIG. 5. The system in FIG. 4 comprises measuring apparatuses 150 and 160, modules 250 and 260 connected to these measuring apparatuses, and a controller 350 connected to modules 250 and 260. The solid lines (261, 264) between each structural element in the figure represent the digital signal lines, while the broken lines (151, 161) represent analog signal lines, and the double lines (262, 361, etc.) represent data buses of the digital data. Module 250 comprises an analog-digital converter (ADC) 251 that receives analog measurement signals from the measuring apparatus 150; an FIFO 253 connected to the output of ADC 251; a communications part 254 connected to FIFO 253; and a control part 255 that controls ADC 251 and communications part 254. The internal structure of the other module 260 is the same as that of module 250; therefore, it is not illustrated in FIG. 4. Moreover, the controller 350 comprises communications parts 355 and 356 that receive output data from modules 250 and 260, a memory 352 that houses the received data 354, and a processor 351 that processes these data 354 and finds the measurement and analysis results.

Next, the operation of the above-mentioned measurement system is described. First, when analog measurement signals are input from measuring apparatus 150, ADC 251 notifies that data have been input to control part 255 and converts analog measurement signals to digital data. The system in FIG. 4 is a structure wherein three types of analog measurement signals (represented as a, b, and c in FIG. 5) are output from measuring apparatus 150; therefore, ADC 251 converts these three types of data to digital data in succession and accumulates them in FIFO 253. The same measurement is repeated three times (1a through 1c, 2a through 2c, 3a through 3c) and when the measurements are completed, control part 255 sends a command to transfer data to communications part 254. Thus, communications part 254 transfers the digital data that have accumulated in FIFO 253 to controller 350 in succession. Communications part 355 within controller 350 stores the digital data that have been received in memory 352. The processor 351 begins data processing when these three data (a, b, c) 354 are received and finds the analysis results.

There is a data transfer 265 between module 250 and controller 350 such as shown in FIG. 4.

However, when the noise that is generated by the digital data transfer mixes with analog signal lines 151 and 161, the measurement accuracy deteriorates. Therefore, the data transfer must be performed after analog signal measurement by the measuring apparatus in FIG. 4, as is clear from the timing chart in FIG. 5. However, when this type of measurement sequence is adopted, it requires time to transfer data after the measurement is completed. In addition, controller 350 can only start processing the data when the data transfer is completed. Therefore, there is a large increase in the time that it takes to obtain measurement results once the measurements are started.

It is possible to transfer the data between each measurement (between 1c and 2a and between 2c and 3a) in order to curtail measurement time, but the control part 255 of module 250 does not know the timing by which analog measurement signals are input from measuring apparatus 150. There is a chance that the following analog measurement signal may input during the data transfer and the electric noise caused by the data transfer may have an effect on the quality of the analog data. Consequently, data transfer should not be performed during the analog data measurement.

SUMMARY OF THE INVENTION

The present invention solves the above-mentioned problems with a measurement system comprising modules that receive analog measurement signals and output digital data and a controller that receives these digital data and processes the data, this measurement system being characterized in that these modules comprise a measuring means that converts analog measurement signals to digital data and measure the data, an output means for outputting these digital data, and a control means for controlling the timing of measurements and the timing of output, and in that control by this control means is accomplished by performing output during the breaks between multiple measurements.

This invention makes it possible for the modules to control the timings of when to allow the analog measurement, and when to transfer the digital data to the controller. Digital data is transferred successfully to the controller between measurements without interfering with the analog data input quality.

The measuring method of the present invention makes high-speed measurement possible while preventing a deterioration of measurement precision by the electrical noise that is generated during the data transfer by means of modules and a system.

DETAILED DESCRIPTION OF THE PREFERRED EMBODIMENT

Figure 1:
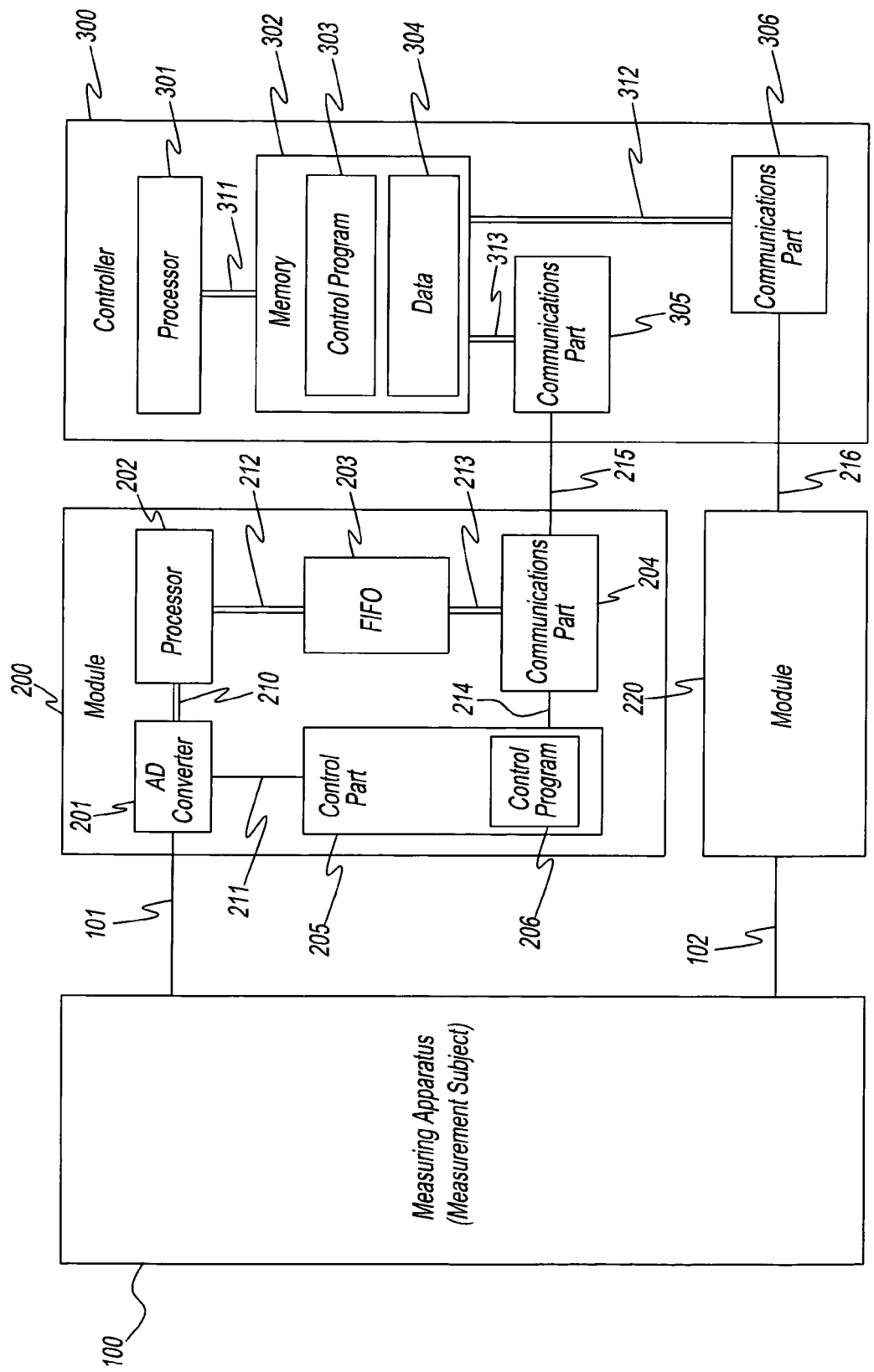
FIG. 1 is a schematic drawing of the measurement system of an embodiment of the present invention.

A preferred embodiment of the measurement system of the present invention is described in detail while referring to the drawings.

FIG. 1 is a general structural diagram of a TFT array substrate measurement system, which is the measurement system of the present invention. This system comprises measurement modules 200 and 220 connected to a measuring apparatus 100, and a controller 300 connected to modules 200 and 220. The solid lines (211, 215, etc.) between each of the structural elements in the figure are the digital signal lines, while the broken lines (101, 102) are the analog signal lines, and the double lines (210, 311, etc.) are data buses of the digital data.

Measuring apparatus 100 is a measuring apparatus with a TFT array substrate. Analog signals of electric current, voltage, charge, and the like flowing to the array substrate at multiple measurement points are the output from the apparatus. Measuring apparatus 100 is not limited to a voltmeter, ammeter, and the like, and can be an optical sensor, piezoelectric element, and the like. The number of measuring apparatuses is not limited to one. There can be multiple apparatuses.

Module 200 comprises an analog-digital converter (ADC) 201, which is a measuring means that performs analog-digital conversion when it receives analog measurement signals from the measuring apparatus 100; a processor 202, which is a processing means connected by data bus 210 to the output of ADC 201; an FIFO 203, which is connected to processor 202 by data bus 212; a communications part 204, which is the output means connected to the output of FIFO 203 by the data bus 213; and a control part 205, which is the control means connected to ADC 201 and communications part 204 by control signal lines 211 and 214. Control part 205 has a memory that can be rewritten so that it can house a control program 206. The internal structure of the other module 220 is the same as that of module 200; therefore, it is not shown in FIG. 1. The structure is not necessarily limited to two modules; the present invention may also have one module or three or more modules.

The controller 300 comprises communications parts 305 and 306 that receive output data from modules 200 and 220; a memory 302 connected to the communications part 305 by data buses 312 and 313; and a processor 301 connected to a memory 302 by the data bus 311. Data transfer between module 200 and controller 300 employs a serial data transferring system that includes 8B/10B conversion (for instance, the conversion technology cited in JP (Kokai) 59[1984]-010,056); therefore, the data can be transferred using small number of data lines 215 and 216. Data 304 received from module 200, module 220 and a control program 303 are housed inside memory 302.

Figure 2:
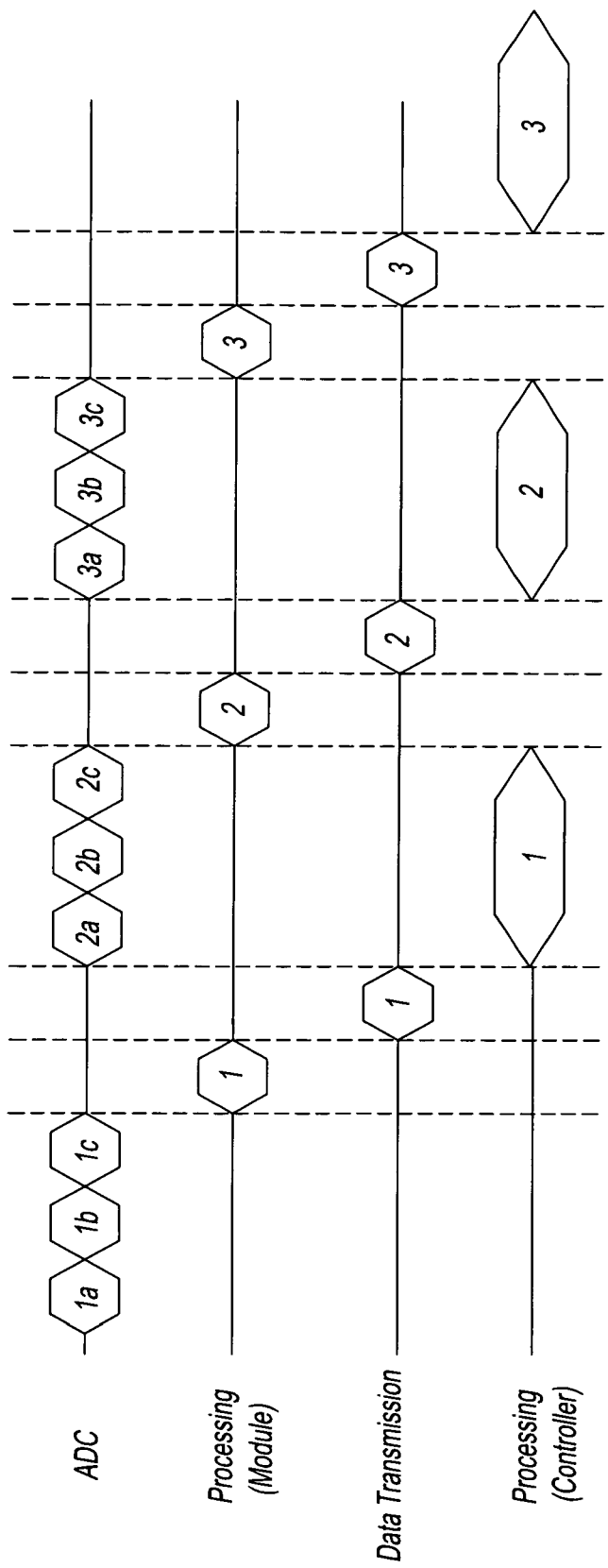
FIG. 2 is a time chart of the measurement system of an embodiment of the present invention.

The operation of this system is described while referring to the structural drawing in FIG. 1 and the time chart in FIG. 2. It should be noted that the system of the present working example is a measurement system for evaluating the quality of a TFT array. The electric current flowing through the TFT array is measured for each element and the relationship between the brightness or defects, and the electric current flow is measured at module 200. Moreover, module 200 or 220 can measure an electric conductivity in order to evaluate the quality of the connection between each element, and controller 300 finds the coefficient of compensation for each element and the quality of the TFT array based on the results from the each module.

Figure 3:
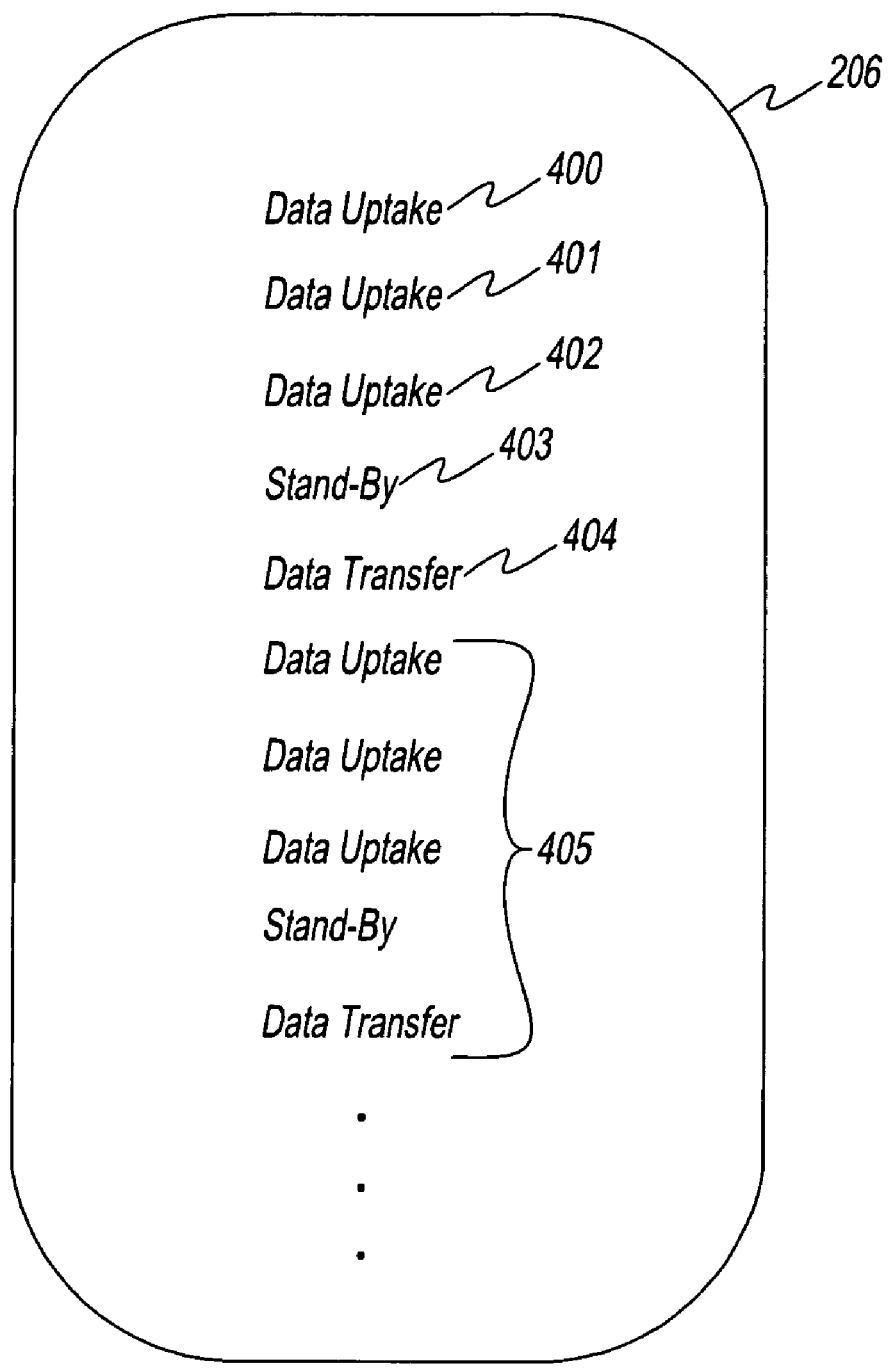
FIG. 3 is an example of the control program of an embodiment of the present invention.

When an operator selects a program that measures a TFT array substrate from multiple control programs 303 housed in memory 302 of controller 300, the selected program is transferred by the communications part 305 inside of controller 300 through the communications part 204 inside of module 200 and stored inside control part 205 of module 200. As shown in detail in FIG. 3, the control program 206 records over time the procedure that module 200 is performing, that is, receiving of analog signals from the measuring apparatus (data uptake), transfer of digital data to the controller 300 (data transfer), or no operation (stand-by), and the control part 205 executes the details of the control program 206 in succession in accordance with the internal clock.

Control part 205 implements controls based on an initial data uptake order 400 such that analog measurement signals are received at ADC 201 from measuring apparatus 200. ADC 201 converts electric current values (analog measurement signals) corresponding to the first brightness of the first element to digital data and transfers these data to processor 202 (data 1a in FIG. 2). Processor 202 is designed such that when digital data (a, b, c) corresponding to three types of brightness are input, the relationship between the brightness of the element and the current is found. However, only data corresponding to the first brightness are input at this time; therefore, the data processing is not performed at this point, and the input digital data is stored.

Similarly, a second data uptake command 401 and a third data uptake command 402 are issued, and analog current values corresponding to the second and third brightnesses are converted to digital data by ADC 201 and sent to the processor 202 (data 1b, 1c in FIG. 2). The processor 202 finds the slope of the electric current values to the brightness of the first pixel by first order approximation from the three data sets (1a, 1b, 1c) when the third data set has been input. As a result, the amount of data from the measurement findings is reduced from the data for three brightnesses to data for one slope, and the amount of data transferred between module 200 and controller 300 can be reduced to ⅓. The slope data that is calculated is transferred to FIFO 203.

Figure 4:
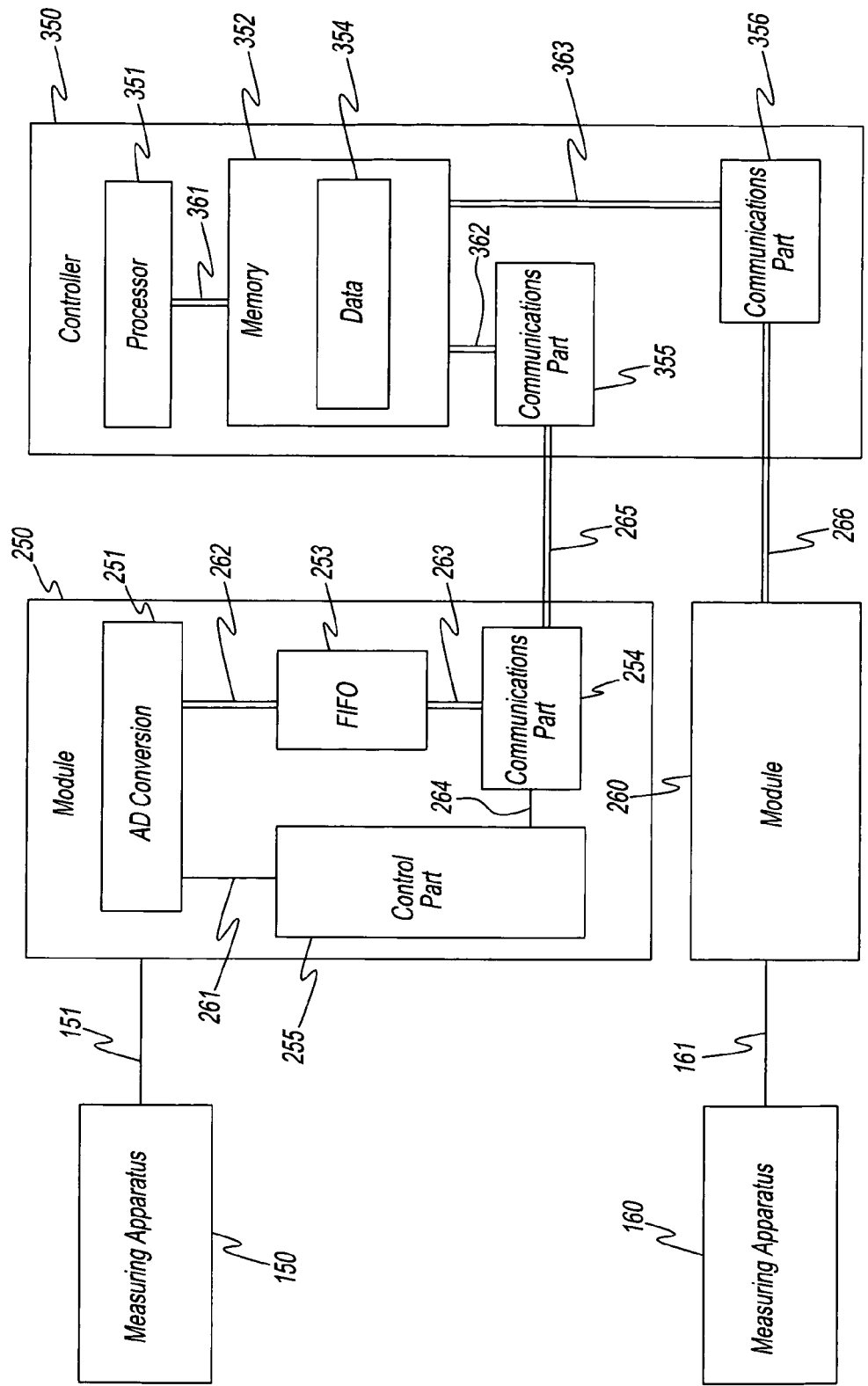
FIG. 4 is a schematic drawing of a measurement system of the prior art.

Next, a data transfer command 404 is given. Communications part 204 receives data with the slope of the first pixel from FIFO 203, and it performs 8B/10B conversion, parallel to serial conversion, and outputs the data of controller 300. The serial to parallel conversion, extension treatment, and the like are performed, digital data are regenerated, and the slope of the first pixel data is stored in memory 302. By means of the present working example, the amount of transferred data can become smaller, because of using the processor 202 as a method of data compression. The data transfer time is shorter when compared to the data transfer without using the processor by the prior art shown in FIG. 4.

Measuring apparatus 100 can pursue several measuring process depend on user's application. One example of the processing is the following. Electrical continuity of the first pixel wire is measured by module 220 as module 200 is measuring the relationship between the brightness of the first pixel and the current and the received measurement data 304 stored in memory. Processor 301 evaluates the quality of the first pixel and calculates the compensation data from the gradient data from module 200 and from electrical continuity data obtained by parallel measurement by module 220.

Similarly, module 200 measures the brightness and the current of the second pixel (2a, 2b, 2c) by the group of commands 405 of the sixth to the tenth commands, finds the relationship between the brightness and the current, and transfers this to controller 300. Moreover, controller 300 assesses the electrical continuity data of the second pixel measured by module 200 and evaluates the quality of the second pixel.

Measuring apparatus 100 of the present working example processes and transfers data while changing the measured pixel from the measurement of the first pixel to the measurement of the second pixel. Control program 206 can be designed so that when the time used to change the measured pixel is too short for the data transfer, only the data processing is conducted and the data is stored in FIFO 203. When the measurement interval is long enough for the data transfer, the data housed in FIFO 203 is transferred to the controller. The processing function of processor 202 is not limited to finding the relationship of the acquired data as described above and should also include processing to reduce the amount of data, such as averaging of multiple groups of data and condensing data. Furthermore, by means of the present working example, the same measurement is performed in succession for the first and second elements, but the "multiple measurements" of the present invention include not only the case where the same measurement is repeated multiple times, but also the case where different measurements are conducted in succession.

Here's another example of the measuring process. The Electric characteristics of the first pixel are measured by the module 200. The pixel data (1a, 1b, 1c of FIG. 2) from the module is processed by the processor 202 and transferred to the controller memory 304. The processor 301 then evaluates the quality of the first pixel by analyzing the data in memory 304. When the measurement of the first pixel is completed, the controller 205 uses a group of commands 405 in FIG. 3. to instruct the module 200 to measure the next pixel. (2a, 2b, 2c), and performs similar tasks which was done for the first pixel. The module 220 measures a different pixel in parallel to the module 200. When pixel data from each module is transferred to the controller memory 304, the processor 301 can perform an analysis for the entire TFT array based on the each pixel information.

The processes disclosed above are examples of the measuring process. The claimed invention is not limited to the above processes. This invention can be applied to other measuring processes.

Figure 5:
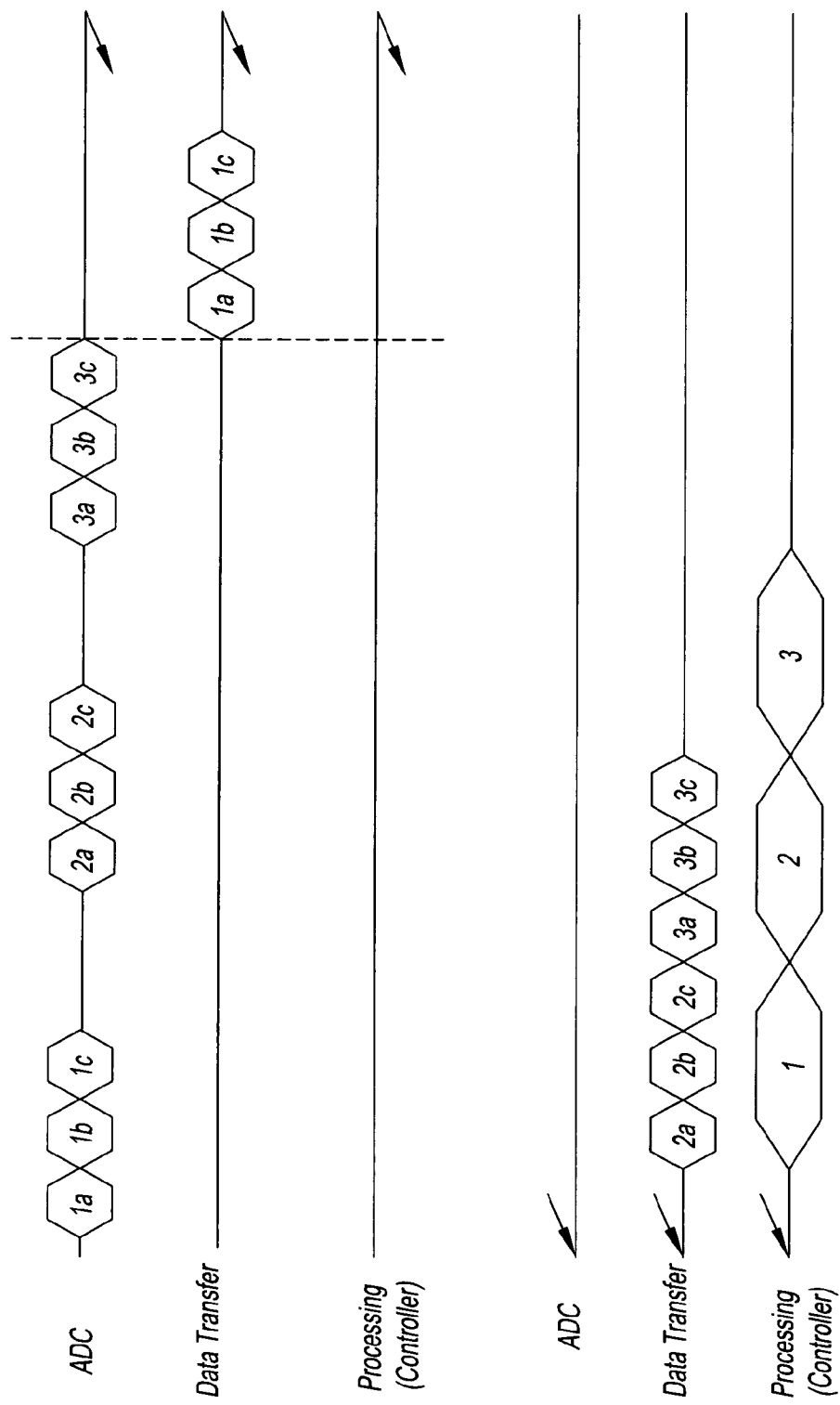
FIG. 5 is a time chart of a measurement system of the prior art.

As is clear from a comparison of FIG. 2, which is a time chart of the present working example, and FIG. 5, which is a time chart of the prior art, by means of the present measurement system, each module "knows" the measurement sequence from the control program; therefore, it is possible to efficiently process and transfer data while in between measurements of analog measurement signals. As a result, it is possible to minimize the noise that accompanies during the digital data transfer that affect the analog measurement quality, to maintain a high measurement precision, and to reduce the time needed for the overall measurement operation. Moreover, controlling ADC 201 and communications part 204 by means of software simplify the structure of the hardware, and the measurement sequence can easily be changed using centrally managed software with memory 303 of controller 300.

What is claimed is:

1. A measurement system comprising:
    one or more modules for receiving analog measurement signals; and
    a controller located apart from the one or more modules for receiving and processing data from the one or more modules,
    wherein each module includes:
        a converter for performing analog to digital conversions of the analog measurement signals to digital data;
        a processor for processing the digital data to produce reduced data;
        a communication device for transferring the reduced data to the controller; and
        a control device for controlling timing of the converter, processor and communication device so that processing the digital data to produce reduced data and transferring the reduced data to the controller occurs only between analog to digital conversions to reduce noise.

2. The measurement system of claim 1, wherein said control device operates to control timing by executing a program transferred to a memory in the control device by the controller.

3. The measurement system of claim 1, further comprising a measurement apparatus for providing analog signals to a device being measured and for providing the resulting measurement analog signals to the one or more modules.

4. The measurement system of claim 1, further comprising a FIFO connected to the processor and the communication device for storing the reduced data before transfer.

5. A method comprising:
    receiving analog measurement signals by one or more modules; and
    receiving and processing data from the one or more modules;
    the method further comprising:
        performing analog to digital conversions of the analog measurement signals to digital data;
        processing the digital data to produce reduced data;
        transferring the reduced data to a controller only between analog to digital conversions; and
        controlling the timing of the analog to digital conversions, processing of the digital data, and transferring of the reduced data to reduce noise.

6. The method of claim 5, comprising executing a program provided by the controller to control the processing of the digital data and the transferring of the reduced data.

7. The method of claim 5, comprising storing the reduced data before transfer.

8. A module comprising:
    a converter for performing analog to digital conversions of analog measurement signals to digital data;
    a processor for processing the digital data to produce reduced data;
    a communication device for transferring the reduced data to a controller; and
    a control device for controlling timing of the converter, processor and communication device so that processing the digital data to produce reduced data and transferring the reduced data occurs only between analog to digital conversions to reduce noise.

9. The module of claim 8, wherein the control device includes a memory for receiving a program from the controller and the control device is operable to control the timing of the converter, processor and communication device by executing the program.

10. The module of claim 8, further comprising a FIFO connected to the processor and the communication device for storing the reduced data before transfer.

* * * * *